United States Patent
Choi et al.

(10) Patent No.: US 7,351,629 B2
(45) Date of Patent: Apr. 1, 2008

(54) METHOD OF FORMING NON-VOLATILE MEMORY DEVICE

(75) Inventors: Yong-Suk Choi, Seoul (KR); Og-Hyun Lee, Kyunggi-do (KR)

(73) Assignee: Samsung Electronics Co, Ltd., Suwon-Si (KR)

( * ) Notice: Subject to any disclaimer, the term of this patent is extended or adjusted under 35 U.S.C. 154(b) by 579 days.

(21) Appl. No.: 11/012,531

(22) Filed: Dec. 15, 2004

(65) Prior Publication Data

US 2005/0101080 A1    May 12, 2005

Related U.S. Application Data

(62) Division of application No. 10/458,133, filed on Jun. 10, 2003, now Pat. No. 6,847,078.

(30) Foreign Application Priority Data

Sep. 9, 2002   (KR) ............................... 2002-54170

(51) Int. Cl.
   *H01L 21/8238* (2006.01)
(52) U.S. Cl. ................. 438/211; 438/257; 438/593; 257/E29.129; 257/E21.68
(58) Field of Classification Search ................. 438/257, 438/211, 593; 257/E29.129, E21.68
   See application file for complete search history.

(56) References Cited

U.S. PATENT DOCUMENTS

| 5,272,100 | A | * | 12/1993 | Satoh et al. | ................. 438/305 |
| 5,559,049 | A | * | 9/1996 | Cho | ........................... 438/304 |
| 5,756,384 | A | * | 5/1998 | Tseng | ......................... 438/257 |
| 6,136,653 | A | * | 10/2000 | Sung et al. | ................. 438/266 |
| 6,621,115 | B2 | * | 9/2003 | Jenq et al. | ................... 257/314 |

* cited by examiner

*Primary Examiner*—Andy Huynh
(74) *Attorney, Agent, or Firm*—F. Chau & Associates, LLC.

(57) ABSTRACT

A non-volatile memory device comprises an active region disposed in a predetermined region of a semiconductor substrate, a selection gate electrode crossing over the active region, and a floating gate electrode disposed on the active region parallel to the selection gate electrode and spaced apart from the selection gate electrode. The non-volatile memory device further comprises a tunnel insulating layer intervening between the active region and each of the selection gate electrode and the floating gate electrode, a separation insulating pattern intervening between the selection gate electrode and the floating gate electrode, an erasing gate electrode disposed over the floating gate electrode and crossing over the active region parallel to the selection gate electrode, and an erasing gate insulating layer intervening between the erasing gate electrode and the floating gate electrode. The selection gate electrode is formed without a photoresist pattern.

12 Claims, 10 Drawing Sheets

METHOD OF FORMING NON-VOLATILE MEMORY DEVICE

CROSS-REFERENCE TO RELATED APPLICATION

This application is a Divisional of U.S. application Ser. No. 10/458,133 filed on Jun. 10, 2003, now U.S. Pat. No. 6,847,078 which is incorporated herein in its entirety by reference.

BACKGROUND OF THE INVENTION

1. Field of the Invention

The present invention relates to a semiconductor device and a method of forming the same and, more particularly, to a non-volatile memory device and a method of forming the same.

2. Discussion of the Related Art

Semiconductor memory devices are classified into volatile memory devices and non-volatile memory devices. Volatile memory devices lose data stored in memory cells when a power supply is turned off. Non-volatile memory devices retain data stored in memory cells when a power supply is turned off. DRAM and SRAM are examples of volatile memory devices and a flash memory device is an example of a non-volatile memory device.

Flash memory devices comprise a floating gate electrode that stores electrons and a control gate electrode that releases or receives electrons. Flash memory devices can be categorized as having either a split gate structure or a stack gate structure.

FIGS. 1-3 are cross-sectional views showing a method of forming a flash memory device having a spit gate structure.

Referring to FIG. 1, a tunnel oxide layer 2, a floating gate conductive layer 3 and a hard mask layer 4 are sequentially stacked on a semiconductor substrate 1. The tunnel oxide layer 2 may be formed of a thermal oxide layer. The floating gate conductive layer 3 may be formed of a doped polysilicon layer. The hard mask layer 4 is formed of silicon nitride.

The hard mask layer 4 is patterned to form a pair of openings 5 exposing a predetermined region of the floating gate conductive layer 3. A capping layer 6 is formed on the exposed floating gate conductive layer 3 through each of the openings 5. The capping layer 6 is a thermal oxide layer. In this case, the thermal oxide layer 6 is thinner near the sidewall of the openings 5 as compared to a middle portion, the thermal oxide layer 6 having a bird's beak shape.

Referring to FIGS. 2 and 3, the hard mask layer 4 is removed by an etch. Thus, the floating gate conductive layer 3 is exposed. Using the capping layer 6 as a mask, the floating gate conductive layer 3 and the tunnel oxide layer 2 are successively etched until the semiconductor substrate 1 is exposed, thereby forming a tunnel oxide pattern 2a. and a floating gate electrode 3a that are sequentially stacked.

A control gate insulating layer 7 and a control gate conductive layer 8 are sequentially formed on a surface of the semiconductor substrate 1. The control gate insulating layer 7 is formed of silicon oxide and the control gate conductive layer 8 is formed of doped polysilicon.

A photoresist pattern 9 is formed on the control gate conductive layer 8. Using the photoresist pattern 9 as a mask, the control gate conductive layer 8 and the control gate insulating layer 7 are successively patterned to form left and right control gate patterns 10a and 10b, respectively. The left and right control gate patterns 10a and 10b are each located on the semiconductor substrate 1 and a corresponding floating gate electrode 3a. Surfaces of the semiconductor substrate 1 under the left and right control gate patterns 10a and 10b are the left and right control gate channels 11a and 11b, respectively. The left control gate pattern 10a comprises a left control gate insulating pattern 7a and a left control gate electrode 8a. The right control gate pattern 10b comprises a right control gate insulating pattern 7b and a right control gate electrode 8b. Impurity ions are implanted into the semiconductor substrate 1 between the pair of floating gate electrodes 3a, thereby forming a common source region 12.

The left and right control gate patterns 10a and 10b are disposed symmetrically. The pair of floating gate electrodes 3a and the common source region 12 are disposed between the left and right control gate channels 11a and 11b, respectively.

When a misalignment occurs during the formation of the photoresist pattern 9, channel lengths k1 and k2 of the left and right control gate channels 11a and 11b may be different. The difference between the channel lengths k1 and k2 may be increased due to an asymmetrical disposition of the channels 11a and 11b. For example, when the photoresist pattern 9 is misaligned to a left direction by 0.1m, the channel length k1 is decreased by 0.1 µm, but the channel length k2 is increased by 0.1 µm. That is, the difference between the channel lengths k1 and k2 is 0.2 µm. Thus, current flowing through the left and right control gate channels 11a and 11b may not be the same, and left and right cells including the left and right control gate channels 11a and 11b may have different cell characteristics.

SUMMARY OF THE INVENTION

According to an embodiment of the present invention, a non-volatile memory device comprises memory cells having substantially similar properties by preventing a misalignment of a photoresist pattern. According to an embodiment of the present invention, a method of forming a non-volatile memory device comprising memory cells having substantially similar properties comprises preventing a misalignment of a photoresist pattern.

According to an embodiment of the present invention, a non-volatile memory device comprises an active region disposed in a predetermined region of a semiconductor substrate. A selection gate electrode crosses over the active region. A floating gate electrode is disposed over the active region adjacent to the selection gate electrode and spaced apart from the selection gate electrode. A tunnel insulating layer intervenes between the active region and each of the selection gate electrode and the floating gate electrode. A separation insulating pattern intervenes between the selection gate electrode and the floating gate electrode. An erasing gate electrode crosses over the active region, parallel to the selection gate electrode, and is disposed over the floating gate electrode. An erasing gate insulating layer intervenes between the erasing gate electrode and the floating gate electrode.

Preferably, the selection gate electrode comprises a selection-vertical part having a first curved sidewall and a first planar sidewall, and a selection-protruding part coupled to a lower part of the first planar sidewall. The floating gate electrode comprises a floating-vertical part having a second curved sidewall and a second planar sidewall, and a floating-protruding part coupled to a lower part of the second planar sidewall. The first and second planar sidewalls are disposed to face each other.

According to an embodiment of the present invention, a method of forming a non-volatile memory device comprises forming a device isolating layer in the semiconductor substrate defining an active region. A support pattern crossing over the active region is formed, wherein the support pattern defines under cut regions between the support pattern and the semiconductor substrate. A tunnel insulating layer is formed on a semiconductor substrate. A first gate conductive layer is formed on a semiconductor substrate with the tunnel insulating layer and fills the under cut regions. The first gate conductive layer is etched by an anisotropic etch, thereby forming a selection gate electrode on a sidewall of the support pattern and a preliminary floating gate electrode on the opposite sidewall of the support pattern. The selection gate electrode and the preliminary floating gate electrode are each shaped like a spacer. The preliminary floating gate electrode is patterned to form a floating gate electrode over the active region. An erasing gate electrode crossing over the active region, parallel to the selection gate electrode, is formed over the floating gate electrode, wherein the selection gate electrode and the floating gate electrode have a selection-protruding part and a floating-protruding part formed inside the under cut regions, respectively.

Forming the support pattern comprises sequentially forming a separation insulating layer and a hard mask layer on the semiconductor substrate with the active region. The hard mask layer and the separation insulating layer are successively patterned to form a preliminary separation insulating pattern and a hard mask pattern that are sequentially stacked and disposed to cross over the active region. The preliminary separation insulating pattern is etched isotropically to form a separation insulating pattern narrower than the hard mask pattern, wherein the hard mask and separation insulating patterns comprise the support pattern. The support pattern defines a pair of under cut regions bordered by a bottom of the hard mask pattern, the active region, and both sidewalls of the separation insulating pattern.

The hard mask layer is preferably formed of an insulating layer having an etch selectivity to the separation insulating layer.

BRIEF DESCRIPTION OF THE DRAWINGS

FIGS. 6a-12a are top planar views showing a method of forming a non-volatile memory device in according to a preferred embodiment of the present invention; and FIGS. 6b-12b are cross-sectional views taken along a line II-II' of FIGS. 6a-12a, respectively.

DETAILED DESCRIPTION OF PREFERRED EMBODIMENTS

Figure 1:
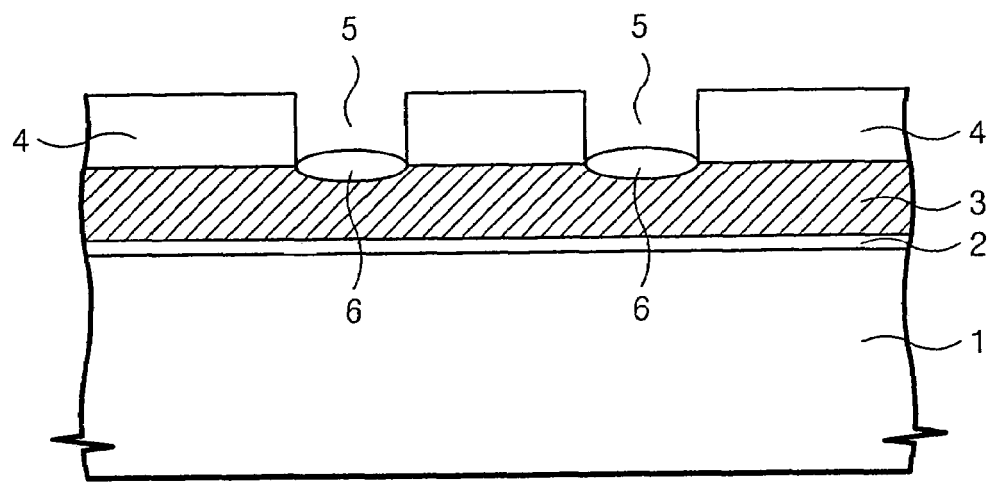
FIGS. 1-3 cross-sectional views showing a method of forming a flash memory device of a spit gate structure.
Figure 2:
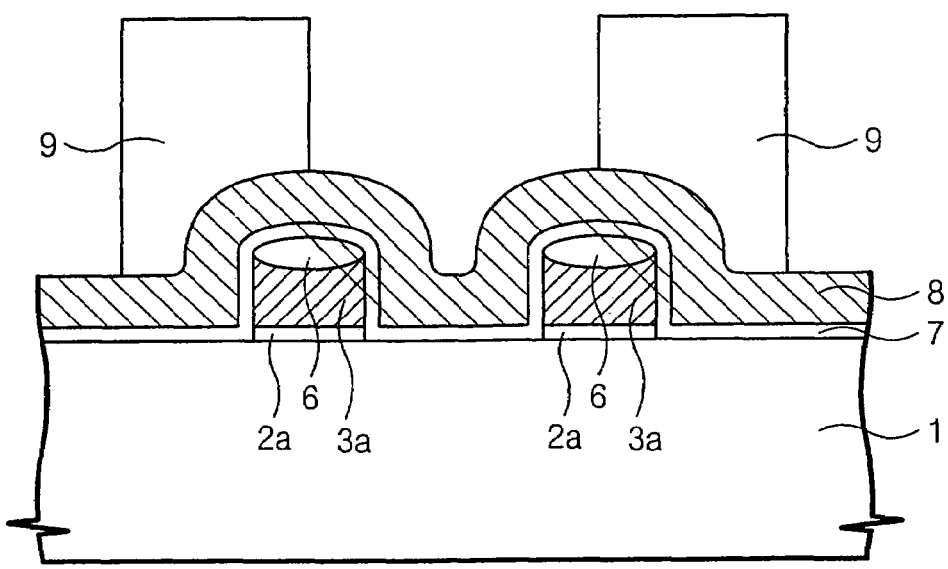
Figure 3:
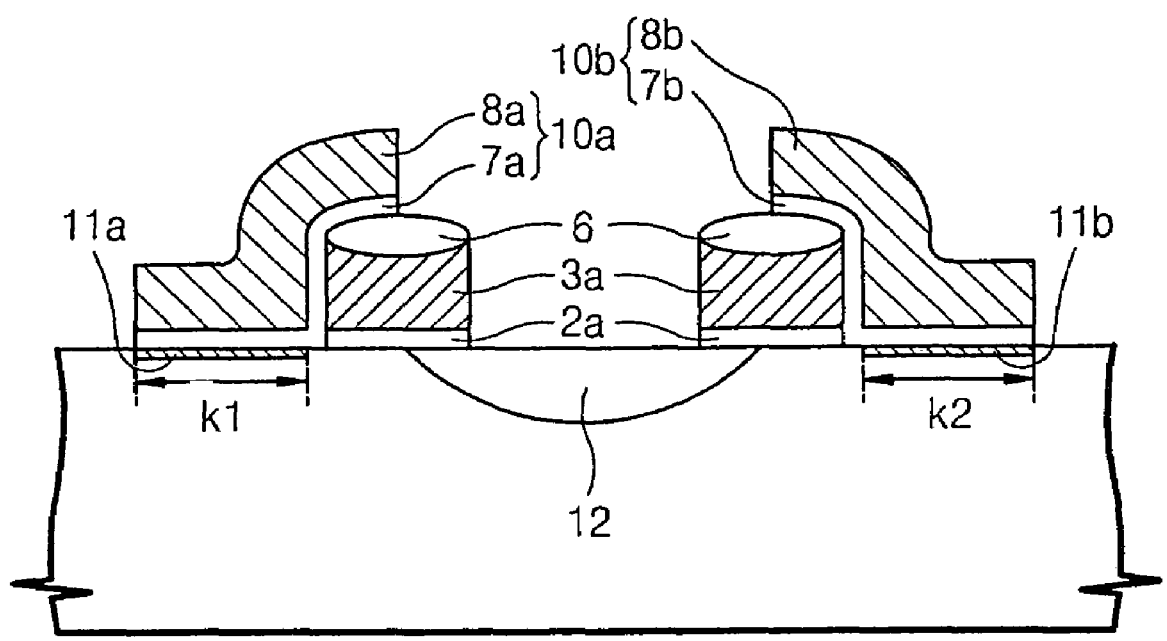

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
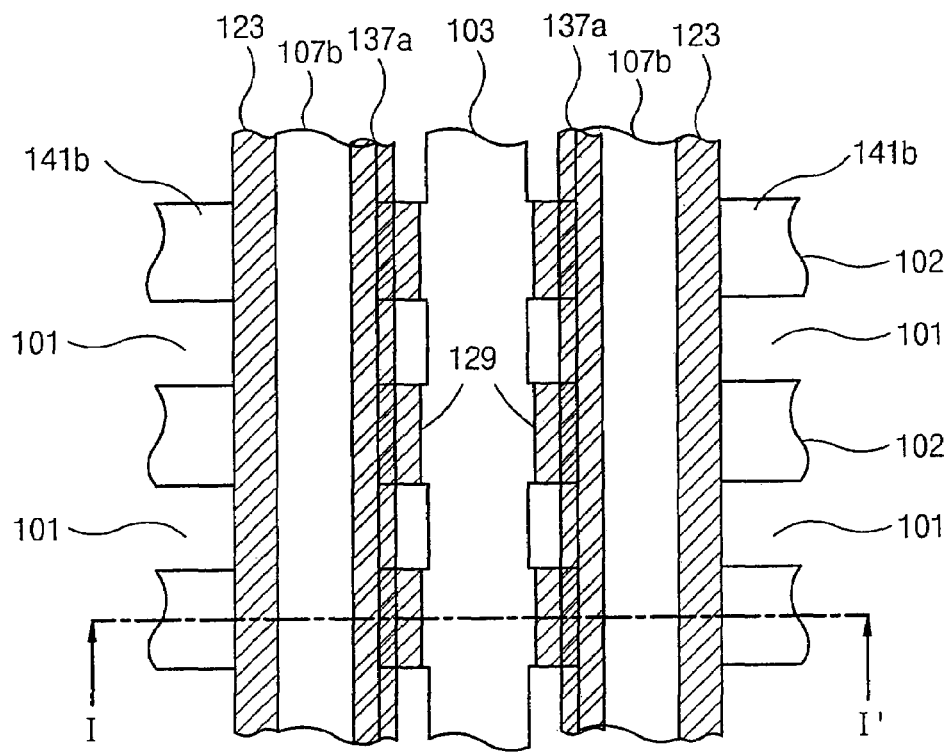
FIG. 4 is a top planar view of a non-volatile memory device according to a preferred embodiment of the present invention.
Figure 5:
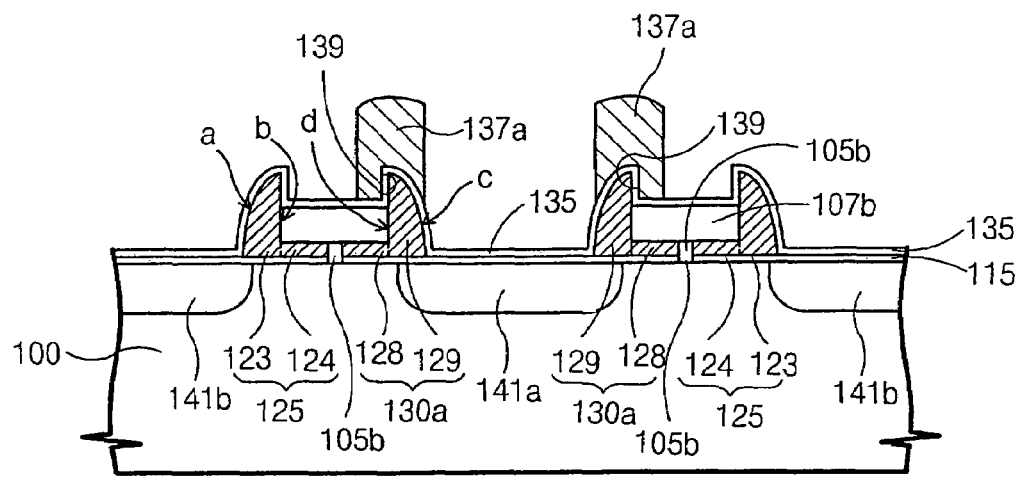
FIG. 5 is a cross-sectional view taken along a line I-I' of FIG. 4.

FIG. 4 is a planar view of a portion of a non-volatile memory device in accordance with a preferred embodiment of the present invention. FIG. 5 is a cross-sectional view taken along a line I-I' of the FIG. 4.

Referring to FIGS. 4 and 5, a plurality of first active regions 102 are disposed in parallel in a predetermined region of a semiconductor substrate 100. A drain region 141b is disposed in a predetermined region of each of the first active regions 102. A second active region 103 crosses the first active regions 102 and intervenes between a pair of drain regions 141b. A common source region 141a is formed in the second active region 103. The common source region 141a and the drain regions 141b are formed of an impurity diffusion layer. The drain regions 141b may be electrically connected to a bit line (not shown).

A pair of selection gate electrodes 125 crosses over the first active regions 102 on both sides of the second active region 103. The selection gate electrode 125 is parallel to the second active region 103. The selection gate electrode 125 crosses over the first active regions 102 between the pair of drain regions 141b.

The selection gate electrode 125 comprises a selection-vertical part 123 and a selection-protruding part 124. The selection-vertical part 123 has a first curved sidewall "a" and a first planar sidewall "b". The selection-protruding part 124 is in contact with a lower portion of the first planar sidewall "b". Bottoms of the selection-vertical and selection-protruding parts 123 and 124 may be disposed at a substantially identical height from the surface of the first active region 102. The pair of the selection gate electrodes 125 are preferably disposed such that the first planar sidewalls thereof face each other.

A floating gate electrode 130a is disposed over the first active region 102, between the selection gate electrode 125 and the common source region 141a. The floating gate electrode 130a is spaced apart from the selection gate electrode 125. The floating gate electrode 130a comprises a floating-vertical part 129 and a floating-protruding part 128. The floating-vertical part 129 comprises a second curved sidewall "c" and a second planar sidewall "d". The floating-protruding part 128 is in contact with a lower portion of the second planar sidewall "d". Bottoms of the floating-vertical and floating-protruding portions 129 and 128 may be disposed at an identical height from the surface of the first active region 102.

The selection gate electrode 125 and the floating gate electrode 130a are disposed symmetrically over the first active region 102. The selection and floating gate electrodes 125 and 130a are disposed such that the first and second planar sidewalls "b" and "d" face each other. The selection and floating gate electrodes 125 and 130a are preferably formed of a doped poly silicon layer.

A separation insulating pattern 105b intervenes between the selection-protruding part 124 and the floating-protruding part 128. The separation insulating pattern 105b electrically insulates the selection gate electrode 125 from the floating gate electrode 130a.

A tunnel insulating layer 115 is disposed between the selection gate electrode 125 and the first active region 102, and between the floating gate electrode 130a and the first active region 102. The tunnel insulating layer 115 is preferably formed of a thermal oxide layer. The tunnel insulating layer 115 may be disposed on the impurity diffusion layers 141a and 141b. The tunnel insulating layer 115 may be omitted from above the impurity diffusion layers 141a and 141b.

A hard mask pattern 107b is preferably disposed between the selection gate electrode 125 and the floating gate electrode 130a. A first sidewall and a second sidewall of the hard mask pattern 107b are in contact with the first and second planar sidewalls "b" and "d", respectively. The selection-protruding part 124 and floating-protruding part 128 are parallel and intervene between the hard mask pattern 107b and the first active region 102. Preferably, a top surface of the hard mask pattern 107b is lower than a top of the floating-vertical part 129. The hard mask pattern 107b may be formed of silicon nitride. The hard mask pattern 107b may be omitted.

An erasing gate electrode 137a crossing over the first active region 102 is disposed over the floating gate electrode 130a. The erasing gate electrode 137a is parallel to the selection gate electrode 125. The erasing gate electrode 137a preferably comprises a lower groove 139 surrounding an upper portion of the floating-vertical part 129. An erasing gate insulating layer 135 is disposed between the erasing gate electrode 137a and the floating gate electrode 130a. The erasing gate electrode 137a may be formed of a doped polysilicon layer, and the erasing gate insulating layer 135 may be formed of silicon oxide. The erasing gate insulating layer 135 may be disposed on the impurity diffusion layers 141a and 141b. The erasing gate insulating layer 135 may be omitted from above the impurity diffusion layers 141a and 141b.

A unit cell of the non-volatile memory device in accordance with a preferred embodiment comprises the selection gate electrode 125, the floating gate electrode 130a, the erasing gate electrode 137a, the source region 141a, and the drain region 141b.

Programming and erasing of the unit cell will be explained as follows.

For programming the unit cell, a turn-on voltage is applied to the selection gate electrode 125 and a program voltage is applied to the common source region 141a. The drain region 141b is grounded. Thus, electrons are injected into the floating gate electrode 130a from the first active region 102 under the floating gate the electrode 130a.

For erasing the unit cell, an erasing voltage is applied to the erasing gate electrode 137a and the common source region 141a is grounded. Therefore, electrons stored in the floating gate electrode 130a are released to the erasing gate electrode 137a. A top of the floating-vertical part 129 is formed having a point, so that an electric field caused by the erasing voltage is concentrated on the top of the floating-vertical part 129. Thus, electrons are released through the top of the floating vertical part 129.

A non-volatile memory device comprising the unit cell may be formed in a cell array on the semiconductor substrate 100.

A method of fabricating the non-volatile memory device will be described herein with reference to FIGS. 6a to 12b. FIGS. 6b, 7b, 8b, 9b, 10b, 11b, and 12b are cross-sectional views taken along a line II-II' of the FIGS. 6a, 7a, 8a, 9a, 10a, 11a, and 12a, respectively.

Figure 6A:
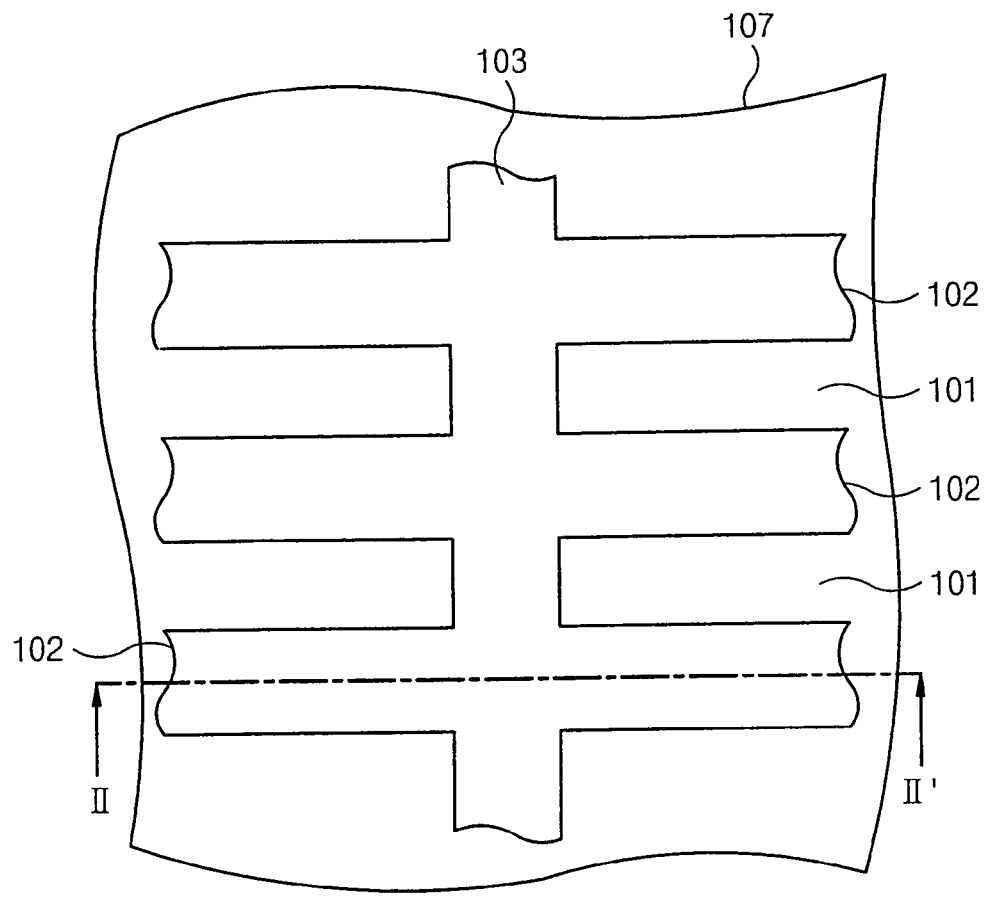
Figure 6B:
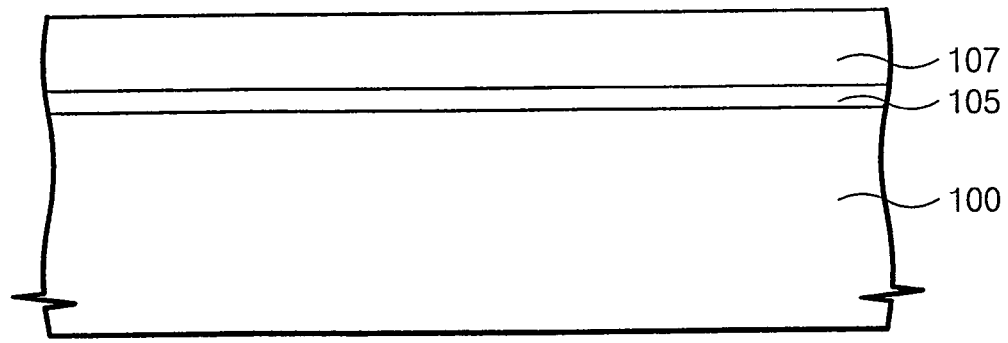

Referring to FIGS. 6a- 6b, a device isolation layer 101 is formed in a predetermined region of a semiconductor substrate 100. The device isolation layer 101 defines a plurality of first active regions 102 arranged in parallel, and a second active region 103 crossing the first active regions 102. The device isolating layer 101 forms a trench isolating layer. A separation insulating layer 105 and a hard mask layer 107 are sequentially formed on the semiconductor substrate 100 with the device isolating layer 101. The separation insulating layer 105 is preferably formed of silicon oxide. The separation insulating layer 105 may be formed of at least one of a chemical vapor deposition (CVD) silicon oxide layer and a thermal oxide layer. The hard mask layer 107 is preferably formed of an insulating layer having an etch selectivity to the separation insulating layer 105, for example, a silicon nitride layer.

Referring to FIGS. 7a, 7b, 8a, and 8b, the hard mask layer 107 and the separation insulating layer 105 are successively patterned to form a pair of preliminary support patterns 109 crossing over the first active regions 102 on both sides of the second active region 103. The preliminary support pattern 109 is comprises a preliminary separation insulating pattern 105a and a hard mask pattern 107a that are sequentially stacked. A plurality of photoresist patterns 111 are formed over a semiconductor substrate 100 with the preliminary support pattern 109. The photoresist patterns 111 cover the device isolating layer 101 and the preliminary support patterns 109 thereon. An isotropic etching, such as a wet etching, is applied to a semiconductor substrate 100 with the photoresist patterns 111, thereby forming support patterns 109a defining under cut regions 113 at lower portions of the both sidewalls. The support pattern 109a comprises a separation insulating pattern 105b and a hard mask pattern 107a that are sequentially stacked. Through the isotropic etching, the preliminary separation insulating pattern 105a is etched at both sidewalls thereof, thereby forming the separation insulating pattern 105b having a width W2 that is shorter than a width W1 of the hard mask pattern 107a. The hard mask pattern 107a has a lower etch selectivity to the isotropic etch than the preliminary separation insulating pattern 105a, so that the preliminary separation insulating pattern 105a is etched faster than the hard mask pattern 107a. The preliminary separation insulating pattern 105a on the device isolating layer 101 comprises a region that is not etched by the isotropic etching. That is, the support pattern 109a on the device isolating layer 101 does not have the under cut regions 113. Accordingly, the under cut regions 113 are surrounded by a bottom of the hard mask pattern 107a, both sidewalls of the separation insulating pattern 105b, and the first active region 102.

After forming the support pattern 109a, the photoresist pattern 111 is removed.

As the photoresist pattern 111 may be omitted. Under cut regions (not shown) may be formed at a lower sidewall of the support pattern 109a on the device isolating layer 101.

Referring to FIGS. 9a, 9b, 10a, and 10b, a tunnel insulating layer 115 is formed on the first active region 102 of the semiconductor substrate 100. The tunnel insulating layer 115 is formed on a surface of the first active region 102 inside the under cut region 113. The tunnel insulating layer 115 is preferably formed of a thermal oxide layer. A first gate conductive layer 117 is formed on an entire surface of the semiconductor substrate 100 with the tunnel insulating layer 115. The first gate conductive layer 117 fills the under cut regions 113. The first gate conductive layer 117 is preferably formed of a conductive material having desirable step coverage, for example, doped polysilicon.

The first gate conductive layer 117 is anisotropically etched until a portion of the tunnel insulating layer 115 is exposed. The etched first gate conductive layer 117 forms a selection gate electrodes 125 on a sidewall of the support patterns 109a and 109b, and preliminary floating gate electrodes 130 on the sidewalls of the support patterns 109a and 109b opposite the selection gate electrodes 125, respectively. The preliminary floating gate electrodes 130 are formed over the first active region 102 and between the support patterns 109a and 109b and the second active region 103, respectively. Each selection gate electrode 125 comprises a selection-vertical part 123 and a selection-protruding part 124. The selection-vertical part 123 is formed on one sidewall of the support patterns 109a and 109b and the selection-protruding part 124 is formed inside the under cut region 113. The shape of the selection-vertical part 123 is substantially similar to a spacer.

Each selection gate electrode 125 comprises the selection-vertical part 123, which is shaped like a spacer through the anisotropic etching. Thus, the selection gate electrodes 125 may be formed to have substantially similar channel widths. Thus, when the selection gate electrodes 125 are formed, a conventional photoresist pattern is not needed. By eliminating the misalignment associated with the use of a photoresist pattern, substantially uniform channel widths can be formed.

Except for the tunnel insulating layer 115 between the first active region 102 and each of the selection gate electrodes 125 and the preliminary floating gate electrodes 130, the exposed tunnel insulating layer 115 may be removed.

Referring to FIGS. 7a, 10a, 10b, 11a, and 11b, the preliminary floating gate electrode 130 is patterned to form a floating gate electrode 130a on the first active region 102. The preliminary floating gate electrode 130 on the device isolating layer 101 is etched until the device isolating layer 101 is exposed, thereby isolating the floating gate electrodes 130a. Each floating gate electrode 130a comprises a floating-vertical part 129 disposed on a sidewall of the support patterns 109a and 109b opposite the selection gate electrodes 125, and a floating-protruding part 128 inside the under cut region 113. The shape of the floating gate electrodes 130a is substantially similar to a spacer.

Figure 7A:
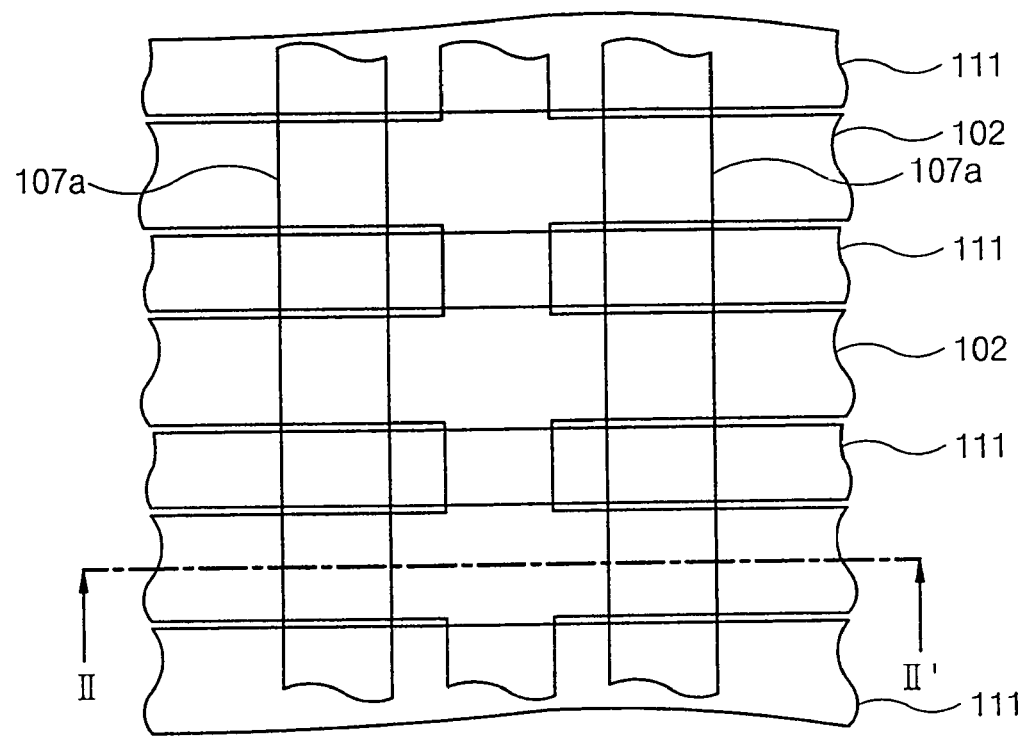
Figure 7B:
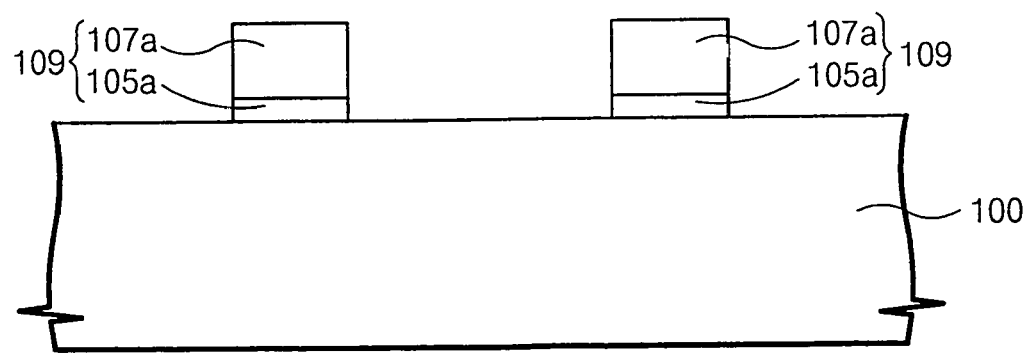
Figure 8A:
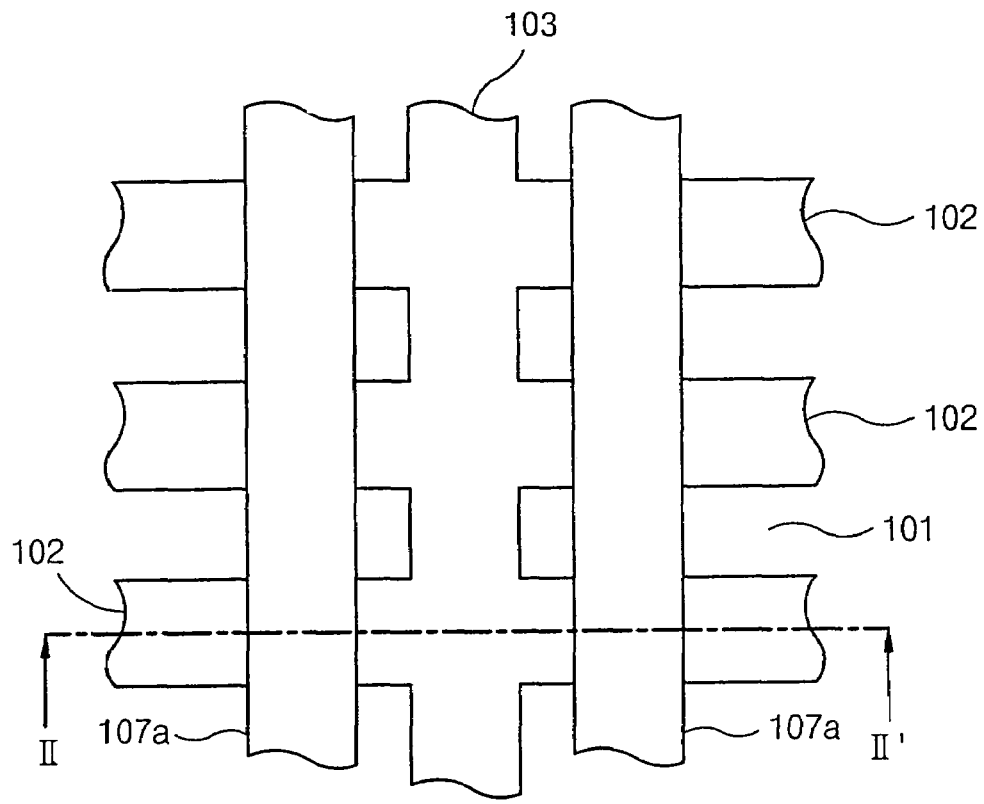
Figure 8B:
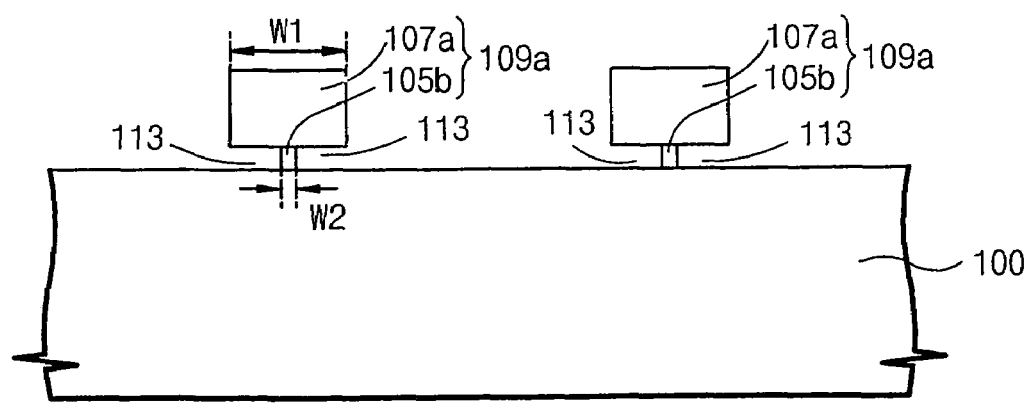
Figure 9A:
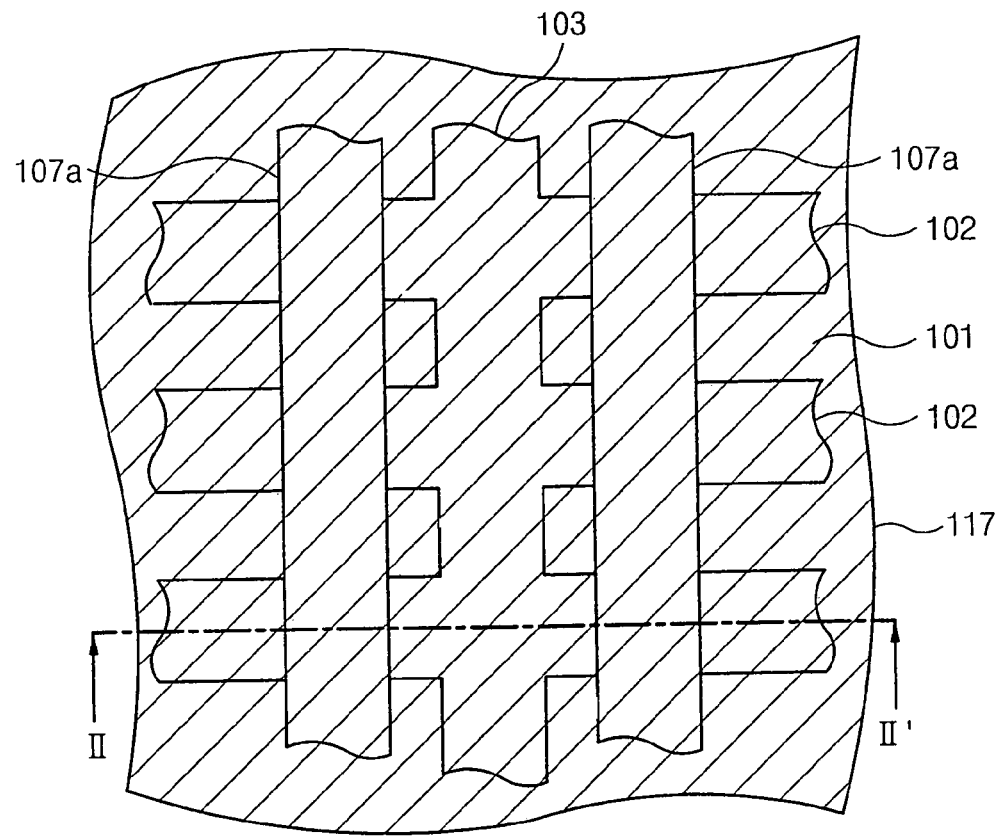
Figure 9B:
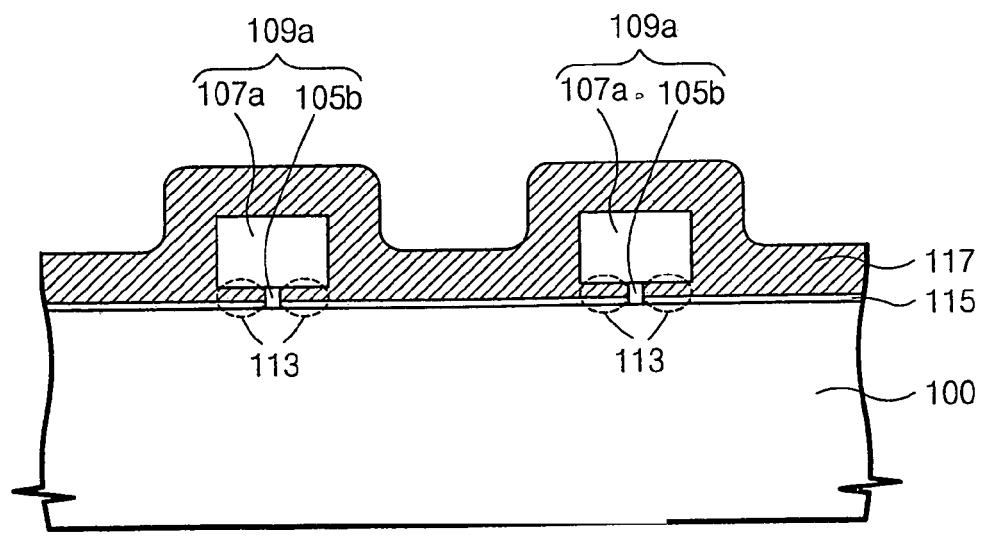
Figure 10A:
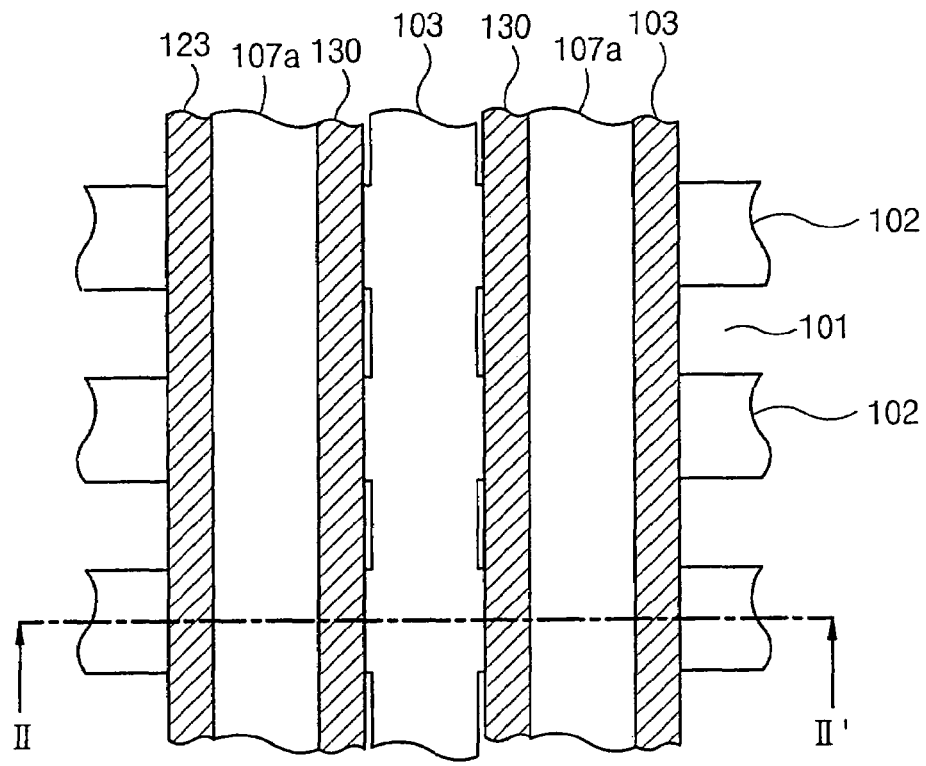
Figure 10B:
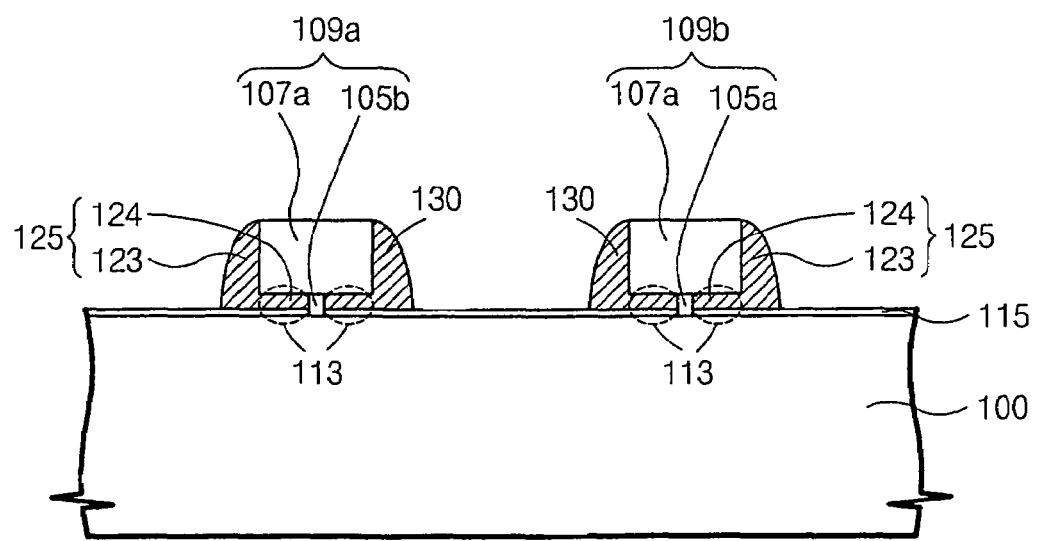
Figure 11A:
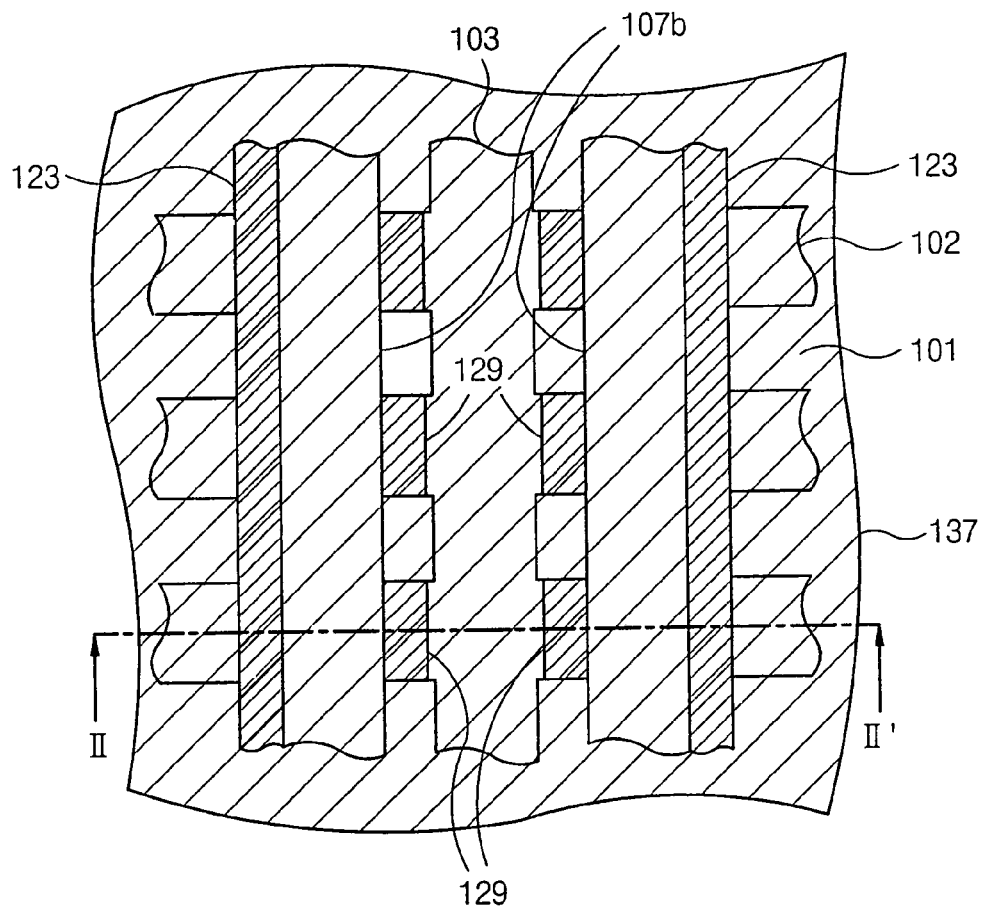
Figure 11B:
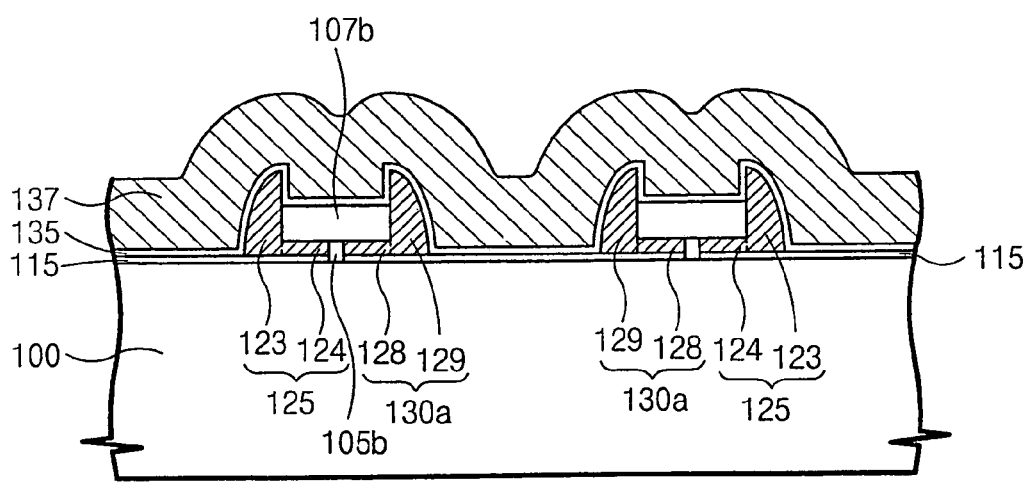

If the photoresist pattern 111 of FIG. 7a is omitted, a predetermined region of the hard mask pattern 107a and the preliminary floating gate electrode 130, which are stacked on the device isolating layer 101, are successively patterned to form a floating gate electrode 130a on the first active region 102. Considering a planar view, a sidewall of the hard mask pattern 107a coupled to the floating gate electrode 130a may be shaped like a dentation. The protruding part of the sidewall of the hard mask pattern 107a is located over the first active region 102.

After forming the floating gate electrode 130a, preferably, the hard mask pattern 107a is recessed using an anisotropic etching process, thereby forming a recessed hard mask pattern 107b. However, the recessed hard make pattern 107b may be etched to expose the selection-protruding part 124 and the floating-protruding part 129.

A conformal erasing gate insulating layer 135 is formed on the surface of the semiconductor substrate 100 with the recessed hard mask pattern 107b. The erasing gate insulating layer 135 may be formed of silicon nitride. A second gate conductive layer 137 is formed on the erasing gate insulating layer 135. The second gate conductive layer 137 may be formed of doped poly silicon.

Figure 12A:
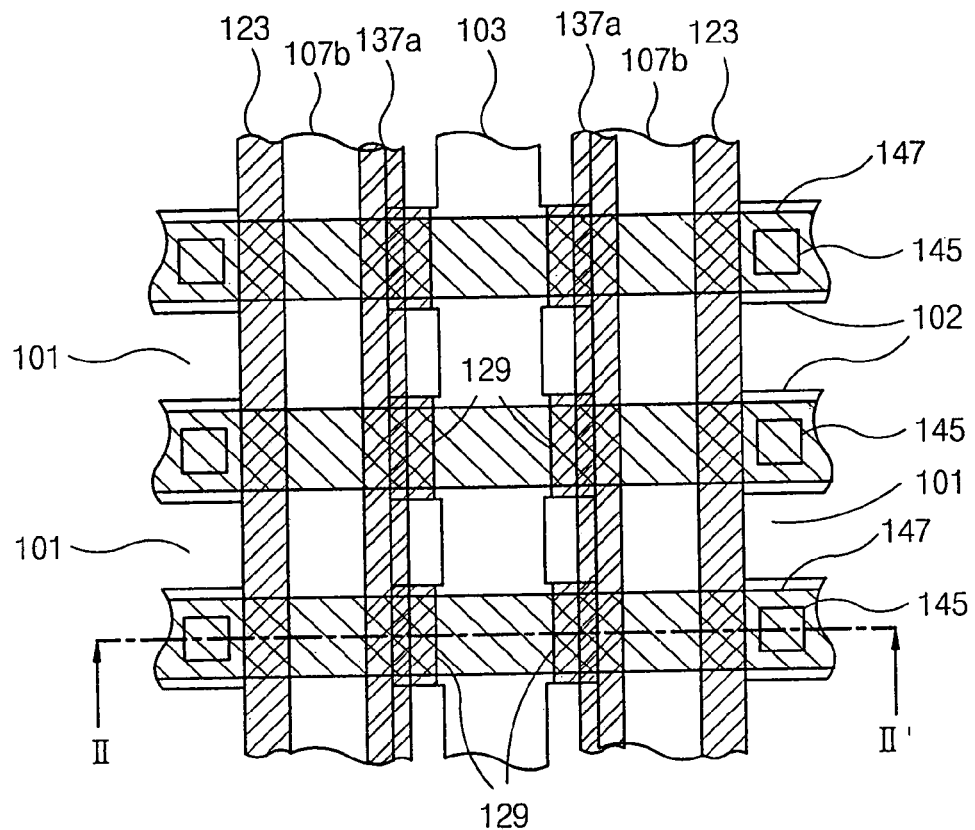
Figure 12B:
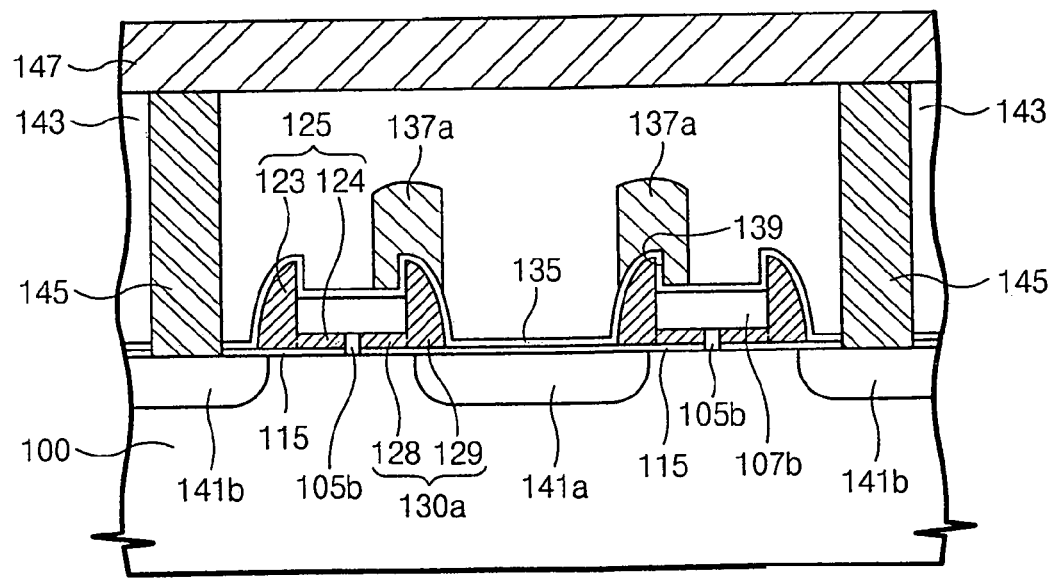

Referring to FIGS. 12a and 12b, the second gate conductive layer 137 is patterned to form an erasing gate electrode 137a crossing over the first active region 102 on an upper portion of the floating gate electrode 130a. The erasing gate electrode 137a is parallel to the selection gate electrode 125 and comprises a lower groove 139 surrounding a top of the floating-vertical part 129. The erasing gate insulating layer 135 may be exposed except for a portion between the erasing gate electrode 137a and the floating gate electrode 130a. The exposed portion of the erasing gate insulating layer 135 may be removed.

Using the erasing gate electrode 137a, the selection gate electrode 125, recessed support pattern 107b and the floating gate electrode 130a as a mask, impurity ions are implanted into the semiconductor substrate 100 to form impurity diffusion layers 141a and 141b. The impurity diffusion layer 141a of the second active region 103 between the erasing gate electrodes 137a corresponds to a common source region. The impurity diffusion layer 141b of the first active region 102 adjacent to the selection gate electrode 125 corresponds to a drain region.

An interlayer dielectric 143 is formed on the surface of the semiconductor substrate 100 with the impurity diffusion layers 141a and 141b. The interlayer dielectric 143 may be formed of silicon oxide and can be planarized. A bit line plug 145 is formed through the interlayer dielectric 143 to electrically connect to the drain region 141b. A bit line 147 is formed to electrically connected to a top surface of the bit line plug 145. The bit line 147 crosses over the selection gate electrode 125. The bit line plug 145 is formed of a conductive layer, for example, a doped poly silicon layer or a metal layer. The bit line 147 may be formed of metal.

According to the present invention, a selection gate electrode is formed in the shape of a spacer on a sidewall of a support pattern. In this case, a photoresist pattern may not be needed for the selection gate electrode. Thus, variations in a channel length of the selection gate electrode due to a misalignment of the photoresist pattern can be avoided. Therefore, property differences between unit cells resulting from the variation of the channel length can be reduced.

What is claimed is:

1. A method of forming a non-volatile memory device comprising:
    defining an active region by forming a device isolating layer in a portion of a semiconductor substrate;
    forming a support pattern that crosses over the active region and defines a first under cut region and a second under cut region between a portion of the support pattern and a portion of the semiconductor substrate;
    forming a tunnel insulating layer on the semiconductor substrate;
    forming a first gate conductive layer on the tunnel insulating layer, the first gate conductive layer filling the under cut regions;
    anisotropically etching the first gate conductive layer to form a selection gate electrode on a first sidewall of the support pattern and a preliminary floating gate electrode on a second sidewall of the support pattern;
    patterning the preliminary floating gate electrode to form a floating gate electrode; and
    forming an erasing gate electrode over the floating gate electrode, wherein the erasing gate electrode crosses over the active region, parallel to the selection gate electrode, and wherein the selection gate electrode and the floating gate electrode have a selection-protruding part and a floating-protruding part that are formed inside the under cut regions, respectively.

2. The method of claim 1, wherein forming the support pattern comprises:
    forming sequentially a separation insulating layer and a hard mask layer on the portion of the semiconductor substrate comprising the active region;
    patterning successively the hard mask layer and the separation insulating layer to form a preliminary separation insulating pattern and a hard mask pattern that are sequentially stacked and placed to cross over the active region; and etching isotropically the preliminary separation insulating pattern to form a separation insulating pattern narrower than the hard mask pattern;

wherein the hard mask pattern and the separation insulating pattern comprise the support pattern; and wherein the support pattern defines a pair of under cut regions surrounded by a bottom of the hard mask pattern, the active region, and the first sidewall and the second sidewall of the separation insulating pattern.

3. The method of claim 2, wherein the separation insulating layer is formed of silicon nitride.

4. The method of claim 2, wherein the hard mask layer is formed of an insulating layer having an etch selectivity lower than an etch selectivity of the separation insulating layer.

5. The method of claim 4, wherein the hard mask layer is formed of silicon nitride.

6. The method of claim 2, further comprising forming a photoresist pattern covering the device isolating layer and the support pattern thereon before forming the separation insulating pattern.

7. The method of claim 1, wherein the tunnel insulating layer is formed of thermal oxide.

8. The method of claim 1, the first gate conductive layer is formed of a doped poly silicon layer.

9. The method of claim 1, further comprising recessing the hard mask pattern after forming the selection gate electrode and the preliminary floating gate electrode, wherein a top surface of the recessed hard mask pattern is lower than a top of the preliminary floating gate electrode.

10. The method of claim 1, further comprising etching to remove the hard mask pattern after forming the selection gate electrode and the preliminary floating gate electrode.

11. The method of claim 1, wherein the forming the erasing gate electrode comprises:

forming a conformal control gate insulating layer and a second gate conductive layer on the surface of the semiconductor substrate with the floating gate electrode; and patterning the second gate conductive layer to form an erasing gate electrode over the floating gate electrode, wherein the erasing gate electrode crosses over the active region and is parallel to the selection gate electrode.

12. The method of claim 1, further comprising implanting impurity ions using the erasing gate electrode, the floating gate electrode, the selection gate electrode and the separation insulating pattern as a mask, thereby forming an impurity diffusion layer in the active region.

* * * * *